(12) United States Patent
Tian et al.

(10) Patent No.: US 11,837,172 B2
(45) Date of Patent: Dec. 5, 2023

(54) GATE DRIVING CIRCUIT AND DISPLAY DEVICE

(71) Applicant: WUHAN CHINA STAR OPTOELECTRONICS TECHNOLOGY CO., LTD., Wuhan (CN)

(72) Inventors: Chao Tian, Wuhan (CN); Yanqing Guan, Wuhan (CN); Guanghui Liu, Wuhan (CN); Fei Ai, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 63 days.

(21) Appl. No.: 17/622,633

(22) PCT Filed: Dec. 15, 2021

(86) PCT No.: PCT/CN2021/138413
§ 371 (c)(1),
(2) Date: Dec. 23, 2021

(87) PCT Pub. No.: WO2023/102978
PCT Pub. Date: Jun. 15, 2023

(65) Prior Publication Data
US 2023/0274701 A1 Aug. 31, 2023

(51) Int. Cl.
G09G 3/3266 (2016.01)
G06F 3/041 (2006.01)
G09G 3/36 (2006.01)

(52) U.S. Cl.
CPC ......... *G09G 3/3266* (2013.01); *G06F 3/0412* (2013.01); *G06F 3/0418* (2013.01); *G06F 3/04166* (2019.05); *G09G 3/3674* (2013.01); *G09G 2310/08* (2013.01); *G09G 2354/00* (2013.01)

(58) Field of Classification Search
CPC ... G09G 3/3266; G09G 3/3676; G09G 3/3677
See application file for complete search history.

(56) References Cited

U.S. PATENT DOCUMENTS

| 10,338,727 B2 * | 7/2019 | Yu ........................ G06F 3/04166 |
| 2017/0124975 A1 * | 5/2017 | Xiao ..................... G09G 3/3677 |
| 2021/0335305 A1 * | 10/2021 | Mi ......................... G11C 19/28 |

* cited by examiner

*Primary Examiner* — Sepehr Azari
(74) *Attorney, Agent, or Firm* — The Roy Gross Law Firm, LLC; Roy Gross

(57) ABSTRACT

A gate driving circuit and a display device are provided. The gate driving circuit includes electrically connected multi-stage driving units. The driving unit of each stage includes an input module, an output module electrically connected with the input module, a pull-down module electrically connected with the output module, and a pull-down control module electrically connected with the pull-down module. The output module is electrically connected to a stage transmission signal output terminal, and the pull-down module is electrically connected to a first control signal terminal.

18 Claims, 2 Drawing Sheets

GATE DRIVING CIRCUIT AND DISPLAY DEVICE

CROSS REFERENCE TO RELATED APPLICATIONS

This application is a National Phase of PCT Patent Application No. PCT/CN2021/138413 having International filing date of Dec. 15, 2021, which claims the benefit of priority of Chinese Application No. 202111509905.8 filed on Dec. 10, 2021. The contents of the above applications are all incorporated by reference as if fully set forth herein in their entirety.

FIELD OF INVENTION

The present application relates to the field of display technologies, and more particularly to a gate driving circuit and a display device.

BACKGROUND OF INVENTION

At present, touch display panels are developing rapidly in mobile phones, tablets, and notebook computers. The application of an in-cell touch technology makes the touch display panel thinner and lower cost. A gate driving solution based on amorphous silicon technology has more mature technology and lower cost, which can realize large-generation panel production, and has always been the mainstream technology solution for medium and large-size display panels. However, due to a high leakage current of an amorphous silicon transistor itself and a high sensitivity to light, it is difficult to apply the in-cell touch technology. In currently used display devices including gate driving circuits of amorphous silicon transistors and in-cell touch technology, in order to eliminate an influence of a leakage current of the amorphous silicon transistor on touch and display, a touch detection can only be performed after each frame of display ends. This cannot achieve high-frequency touch detection like an LTPS (low temperature poly-silicon) transistor, resulting in poor touch sensitivity of the display device.

Technical Problem

At present, the gate driving circuit based on amorphous silicon technology has a technical problem of large leakage current.

SUMMARY OF INVENTION

The present application provides a gate driving circuit and a display device, which are used to alleviate the technical problem of large leakage current in the current gate driving circuit based on amorphous silicon technology.

The present application provides a gate driving circuit comprising electrically connected multi-stage driving units, wherein each stage of the driving unit comprises:
  an input module electrically connected to a constant voltage high potential output terminal and a first node and connected to a first stage transmission signal input terminal;
  an output module electrically connected to a clock signal line and a stage transmission signal output terminal and connected to the first node;
  a pull-down module electrically connected to the first node and a first control signal terminal; and
  a pull-down control module electrically connected to the pull-down module.

In the gate driving circuit of the present application, the driving unit of each stage further comprises a touch control module, the touch control module is electrically connected to the pull-down module, the pull-down control module, and the stage transmission signal output terminal, the touch control module is used to turn off the pull-down module and the pull-down control module and pull down a voltage of the stage transmission signal output terminal during a touch phase.

In the gate driving circuit of the present application, the touch control module is electrically connected to a second control signal terminal, and the second control signal terminal is used to turn on the touch control module in the touch phase and turn off the touch control module in a non-touch phase.

In the gate driving circuit of the present application, the pull-down module comprises a first pull-down module and a second pull-down module, both the first pull-down module and the second pull-down module are electrically connected to the first control signal terminal, the second pull-down module is electrically connected to the pull-down control module, and the first pull-down module is electrically connected to a second stage signal input terminal.

In the gate driving circuit of the present application, the pull-down control module is further electrically connected to the constant voltage high potential output terminal and a constant voltage low potential output terminal, and the touch control module is further electrically connected to the constant voltage low potential output terminal.

In the gate driving circuit of the present application, the input module comprises a first transistor, and a gate and a source of the first transistor are electrically connected to the first stage signal transmission input terminal and the constant voltage high potential output terminal, respectively.

In the gate driving circuit of the present application, the output module comprises a second transistor and a first capacitor, a gate, a source, and a drain of the second transistor are electrically connected to a drain of the first transistor, the clock signal line and the stage transmission signal output terminal, respectively, and both ends of the first capacitor are electrically connected to the gate of the second transistor and the stage transmission signal output terminal, respectively.

In the gate driving circuit of the present application, the first pull-down module comprises a third transistor, and a gate, a source, and a drain of the third transistor are electrically connected to the second stage signal input terminal, the first control signal terminal, and the gate of the second transistor, respectively.

In the gate driving circuit of the present application, the second pull-down module comprises a fourth transistor, and a source and a drain of the fourth transistor are electrically connected to the first control signal terminal and the gate of the second transistor, respectively.

In the gate driving circuit of the present application, the pull-down control module comprises a fifth transistor, a sixth transistor, a seventh transistor, and an eighth transistor, both a gate and a source of the fifth transistor are electrically connected to the constant voltage high potential output terminal, a gate, a source, and a drain of the sixth transistor are electrically connected to the gate of the second transistor, the constant voltage low potential output terminal, and the drain of the fifth transistor, respectively, a gate, a source, and a drain of the seventh transistor are electrically connected to the drain of the fifth transistor, the constant voltage high potential output terminal, and the gate of the fourth transistor, respectively, and a gate, a source and a drain of the eighth transistor are electrically connected to the gate of the second transistor, the constant voltage low potential output terminal, and the gate of the fourth transistor, respectively.

In the gate driving circuit of the present application, the touch control module comprises a ninth transistor, a tenth transistor, and an eleventh transistor, a gate, a source, and a drain of the ninth transistor are electrically connected to the second control signal terminal, the constant voltage low potential output terminal, and the gate of the seventh transistor, respectively, a gate, a source, and a drain of the tenth transistor are electrically connected to the second control signal terminal, the constant voltage low potential output terminal, and the gate of the fourth transistor, respectively, a gate, a source, and a drain of the eleventh transistor are electrically connected to the second control signal terminal, the constant voltage low potential output terminal, and the stage transmission signal output terminal, respectively.

In the gate driving circuit of the present application, the driving unit of each stage further comprises an output maintaining module and a reset module;

the output maintaining module is electrically connected between the constant voltage low potential output terminal and the stage transmission signal output terminal;

the reset module is electrically connected to the constant voltage low potential output terminal, the output module, and the stage transmission signal output terminal and is connected to a reset signal terminal.

In the gate driving circuit of the present application, the output maintaining module comprises a twelfth transistor, a gate, a source, and a drain of the twelfth transistor are electrically connected to the drain of the tenth transistor, the constant voltage low potential output terminal, and the stage transmission signal output terminal, respectively.

In the gate driving circuit of the present application, the reset module comprises a thirteenth transistor and a fourteenth transistor, a gate, a source, and a drain of the thirteenth transistor are electrically connected to the reset signal terminal, the constant voltage low potential output terminal, and the stage transmission signal output terminal, respectively, and a gate, a source, and a drain of the fourteenth transistor are electrically connected to the reset signal terminal, the constant voltage low potential output terminal, and the gate of the second transistor, respectively.

In the gate driving circuit of the present application, a first stage transmission signal input terminal of a nth stage driving unit is electrically connected to a stage transmission signal output terminal of a n−1 stage driving unit;

a second stage transmission signal input terminal of the nth stage driving unit is electrically connected to a stage transmission signal output terminal of a n+1 stage driving unit;

wherein n is a positive integer greater than 1.

The present application further provides a gate driving circuit comprising electrically connected multi-stage driving units, wherein each stage of the driving unit comprises:

a first transistor, wherein a gate, a source, and a drain of the first transistor are electrically connected to a first stage signal input terminal, a constant voltage high potential output terminal, and a first node, respectively;

a second transistor, wherein a gate, a source, and a drain of the second transistor are electrically connected to the first node, a clock signal line, and a stage transmission signal output terminal, respectively;

a third transistor and a fourth transistor, wherein a gate, a source, and a drain of the third transistor are electrically connected to a second stage signal transmission input terminal, a first control signal terminal, and the first node, respectively, and a gate, a source, and a drain of the fourth transistor are electrically connected to a second node, the first control signal terminal, and the first node, respectively;

a fifth transistor, a sixth transistor, a seventh transistor, and an eighth transistor, wherein both a gate and a source of the fifth transistor are electrically connected to the constant voltage high potential output terminal, a gate, a source, and a drain of the sixth transistor are electrically connected to the first node, a constant voltage low potential output terminal, and a third node, respectively, a gate, a source, and a drain of the seventh transistor are electrically connected to the third node, the constant voltage high potential output terminal, and the second node, respectively, and a gate, a source, and a drain of the eighth transistor are electrically connected to the first node, the constant voltage low potential output terminal, and the second node, respectively.

In the gate driving circuit of the present application, the driving unit of each stage further comprises: a ninth transistor, a tenth transistor, and an eleventh transistor, a gate, a source, and a drain of the ninth transistor are electrically connected to the second control signal terminal, the constant voltage low potential output terminal, and the gate of the seventh transistor, respectively, a gate, a source, and a drain of the tenth transistor are electrically connected to the second control signal terminal, the constant voltage low potential output terminal, and the gate of the fourth transistor, respectively, and a gate, a source, and a drain of the eleventh transistor are electrically connected to the second control signal terminal, the constant voltage low potential output terminal, and the stage transmission signal output terminal, respectively.

The present application further provides a display device comprising a gate driving circuit, wherein the gate driving circuit comprises electrically connected multi-stage driving units, and each stage of the driving unit comprises:

an input module electrically connected to a constant voltage high potential output terminal and a first node and connected to a first stage transmission signal input terminal;

an output module electrically connected to a clock signal line and a stage transmission signal output terminal and connected to the first node;

a pull-down module electrically connected to the first node and a first control signal terminal; and a pull-down control module electrically connected to the pull-down module.

In the display device of the present application, the driving unit of each stage further comprises an output maintaining module and a reset module;

the output maintaining module is electrically connected between the constant voltage low potential output terminal and the stage transmission signal output terminal;

the reset module is electrically connected to the constant voltage low potential output terminal, the output module, and the stage transmission signal output terminal and is connected to a reset signal terminal.

In the display device of the present application, the input module comprises a first transistor, a gate and a source of the first transistor are electrically connected to the first stage signal transmission input terminal and the constant voltage high potential output terminal, respectively;

the output module comprises a second transistor and a first capacitor, a gate, a source, and a drain of the second transistor are electrically connected to the drain of the first transistor, the clock signal line, and the stage transmission signal output terminal, respectively, and two ends of the first capacitor are respectively electrically connected to the gate of the second transistor and the stage transmission signal output terminal;

the pull-down module comprises a third transistor and a fourth transistor, a gate, a source, and a drain of the third transistor are electrically connected to the second stage signal input terminal, the first control signal terminal, and the gate of the second transistor, respectively, and a source and a drain of the fourth transistor are electrically connected to the first control signal terminal and the gate of the second transistor, respectively;

the pull-down control module comprises a fifth transistor, a sixth transistor, a seventh transistor, and an eighth transistor, both a gate and a source of the fifth transistor are electrically connected to the constant voltage high potential output terminal, a gate, a source, and a drain of the sixth transistor are electrically connected to the gate of the second transistor, the constant voltage low potential output terminal, and the drain of the fifth transistor, respectively, a gate, a source, and a drain of the seventh transistor are electrically connected to the drain of the fifth transistor, the constant voltage high potential output terminal, and the gate of the fourth transistor, respectively, and a gate, a source, and a drain of the eighth transistor are electrically connected to the gate of the second transistor, the constant voltage low potential output terminal, and the gate of the fourth transistor, respectively;

the output maintaining module comprises a twelfth transistor, a gate, a source, and a drain of the twelfth transistor are electrically connected to the drain of the tenth transistor, the constant voltage low potential output terminal, and the stage transmission signal output terminal, respectively;

the reset module comprises a thirteenth transistor and a fourteenth transistor, a gate, a source, and a drain of the thirteenth transistor are electrically connected to the reset signal terminal, the constant voltage low potential output terminal, and the stage transmission signal output terminal, respectively, and a gate, a source, and a drain of the fourteenth transistor are electrically connected to the reset signal terminal, the constant voltage low potential output terminal, and the gate of the second transistor, respectively.

Beneficial Effect

The application provides a gate driving circuit and a display device. The gate driving circuit includes multi-stage electrically connected driving units. The driving unit of each stage includes an input module, an output module electrically connected with the input module, a pull-down module electrically connected with the output module, and a pull-down control module electrically connected with the pull-down module. The output module is electrically connected to the stage transmission signal output terminal, and the pull-down module is electrically connected to the first control signal terminal. In this application, the pull-down module is electrically connected to the first control signal terminal. The signal output by the first control signal terminal is used to alleviate or eliminate a leakage current from the output module to the pull-down module, improve a display quality, realize a touch detection in a display stage, increase a touch detection frequency, and then improve a touch sensitivity.

DESCRIPTION OF DRAWINGS

In order to explain the embodiments or the technical solutions in the prior art more clearly, the following will briefly introduce the drawings that need to be used in the description of the embodiments or the prior art. Obviously, the drawings in the following description are only some embodiments of the application. For those of ordinary skill in the art, other drawings can be obtained based on these drawings without creative work.

DETAILED DESCRIPTION OF PREFERRED EMBODIMENTS

Figure 1:
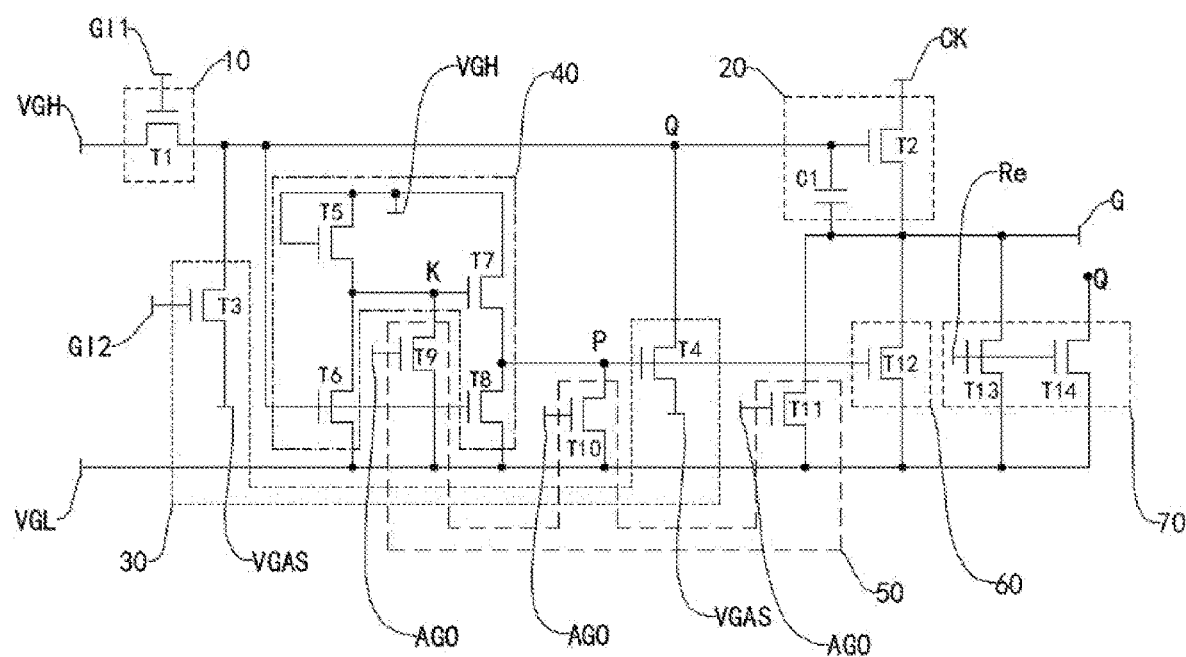
FIG. 1 is a schematic structural diagram of a single-stage driving unit in a gate driving circuit provided by an embodiment of the present application.

The description of the following embodiments refers to the attached drawings to illustrate specific embodiments that the present disclosure can be implemented. The directional terms mentioned in this disclosure, such as "upper", "lower", "front", "rear", "left", "right", "inner", "outer", "side", etc., are only the direction of referring to the attached drawings. Therefore, the directional terms used are used to illustrate and understand the present disclosure, rather than to limit the present disclosure. In the figure, units with similar structures are indicated by the same reference numerals.

Embodiments of the present application provide a gate driving circuit and a display device. The gate driving circuit includes multi-stage electrically connected driving units. The driving unit of each stage includes an input module, an output module electrically connected with the input module, a pull-down module electrically connected with the output module, and a pull-down control module electrically connected with the pull-down module. The output module is electrically connected to a stage transmission signal output terminal, and the pull-down module is electrically connected to a first control signal terminal. In the embodiment of the present application, the pull-down module is electrically connected to the first control signal terminal. A signal output by the first control signal terminal is used to alleviate or eliminate a leakage current from the output module to the pull-down module, improve a display quality, realize a touch detection in a display stage, increase a touch detection frequency, and then increase a touch sensitivity.

The structure and function of the gate driving circuit provided in the present application will be described below in conjunction with specific embodiments.

In an embodiment, referring to FIG. 1, which is a schematic structural diagram of a single-stage driving unit in a gate driving circuit provided by an embodiment of the present application. The gate driving circuit provided in this embodiment includes multi-stage driving units electrically connected in sequence. The driving unit at each stage includes an input module 10, an output module 20, a pull-down module 30, and a pull-down control module 40. It can be understood that the gate driving circuit is used to output a gate driving signal to drive a pixel circuit to work, so as to realize a light-emitting display function of a display device. Each stage of the driving unit corresponds to a stage of display unit in the display device, and each stage of the driving unit can output a gate driving signal required by the stage of display unit. The drive units at all stages are electrically connected in turn, and coordinate output status through a stage transmission signal. The stage transmission signal may be a gate driving signal.

In each stage of the driving unit, the output module 20 is electrically connected to the input module 10. The input module 10 is used to input a power signal and drive the output module 20 to turn on. The output module 20 is used to control an output of a transmission signal of a current stage. The pull-down module 30 is electrically connected to the output module 20 and is used to pull down a control voltage of the output module 20 at a specific moment to turn off the output module 20. The pull-down control module 40 is electrically connected to the pull-down module 30, and is used to turn off the pull-down module 30 at a certain time and turn on the pull-down module 30 at another time.

Further, the input module 10 is electrically connected to the constant voltage high potential output terminal VGH, a first stage signal transmission input terminal GI1, and the output module 20. The constant voltage high potential output terminal VGH can provide a constant high potential signal. The high potential signal is transmitted to the output module 20 via the input module 10 to control an on state of the output module 20. The first stage transmission signal input terminal GI1 is used to input a stage transmission signal to the driving unit of the stage and use the stage transmission signal to control an on state of the input module 10, thereby controlling whether the high potential signal can be transmitted to the output module 20 via the input module 10. There is a first node Q on an electrical connection line between the input module 10 and the output module 20. It can be understood that both the input module 10 and the output module 20 are electrically connected to the first node Q.

The output module 20 is also electrically connected to the clock signal input terminal CK and the stage transmission signal output terminal G. The clock signal input terminal CK is used to input a clock signal. According to the voltage state of the first node Q, the output module 20 selects whether to output the clock signal to the stage transmission signal output terminal G. The stage transmission signal output terminal G is used to output the current stage gate driving signal, and the gate driving signal is also the current stage transmission signal. It can be understood that the stage transmission signal output terminal G of the current stage is electrically connected to the stage transmission signal input terminals of the other stage driving units, so as to transmit the current stage transmission signal to the other stage driving units.

The pull-down module 30 is electrically connected to the first node Q and is electrically connected to the second stage signal input terminal GI2 and the first control signal terminal VGAS. The pull-down module 30 is used to pull down the voltage of the first node Q at a specific moment, so as to turn off the output module 20. The second stage signal transmission input terminal GI2 is used to input a stage transmission signal to the driving unit of this stage and control the on state of the pull-down module 30. The first control signal terminal VGAS may output a low potential signal in the non-touch phase and output a high potential signal in the touch phase. It can be understood that the non-touch phase refers to a phase in which the gate driving circuit outputs a driving signal required for display without outputting a touch driving signal. The touch stage refers to a stage in which the gate driving circuit outputs a touch driving signal, and in the touch phase, the gate driving circuit also outputs the driving signal for displaying to maintain the display state. Therefore, the first node Q maintains a high voltage state during the touch phase. In this embodiment, the first control signal terminal VGAS is used to input a high potential signal to the pull-down unit 30 during the touch phase. This balances the voltage state across the pull-down module 30. This reduces or eliminates the leakage current from the first node Q to the pull-down unit 30, thereby improving the stability of the output signal of the gate driving circuit.

Further, the pull-down module 30 includes a first pull-down module and a second pull-down module. Both the first pull-down module and the second pull-down module are electrically connected to the first control signal terminal VGAS. The first pull-down module is also electrically connected to the second stage signal input terminal GI2 and the first node. The first pull-down module is used under the control of the stage transmission signal input from the second stage transmission signal input terminal GI2, and the signal input by the first control signal terminal VGAS is selectively transmitted to the first node Q. The second pull-down module is also electrically connected to the pull-down control module 40 and the first node Q. The second pull-down module is configured to selectively transmit the signal input by the first control signal terminal VGAS to the first node Q under the control of the pull-down control module 40.

The pull-down control module 40 is electrically connected to the first node Q, the constant voltage high potential output terminal VGH, the constant voltage low potential output terminal VGL, and the pull-down module 30. Specifically, the pull-down control module 40 is electrically connected to the second pull-down module. The pull-down control module 40 can selectively output the high potential signal provided by the constant voltage high potential output terminal VGH and the low potential signal provided by the constant voltage low potential output terminal VGL to the second pull-down module. This realizes the control of the open state of the second pull-down module. A second node P exists on the electrical connection line between the pull-down control module 40 and the second pull-down module. It can be understood that both the pull-down control module 40 and the second pull-down module are electrically connected to the second node P.

Furthermore, the driving unit of each stage further includes a touch control module 50. The touch control module 50 is electrically connected to the pull-down module 30, the pull-down control module 40, and the stage transmission signal output terminal G. The touch control module 50 is used to turn off the pull-down module 30 and the pull-down control module 40 and pull down the voltage of the stage signal output terminal G during the touch phase. Specifically, the touch control module 50 is electrically connected to the pull-down module 30 through the second node P and is electrically connected to the pull-down control module 40 through a third node K.

The touch control module 50 is also electrically connected to the second control signal terminal AGO and the constant voltage low potential output terminal VGL. The control signal provided by the second control signal terminal AGO can turn on the touch control module 50 in the touch phase and turn off the touch control module 50 in the non-touch phase. It can be understood that in the touch phase, the second control signal terminal AGO turns on the touch control module 50. Further, the constant voltage low potential output terminal VGL pulls down the voltages of the second node P, the third node K, and the stage transmission signal output terminal G to a low voltage state. In this way, the effect of turning off the pull-down module 30 is achieved, and the leakage of the first node Q to the pull-down module 30 is further avoided.

Furthermore, the driving unit of each stage further includes an output maintaining module 60 and a reset module 70. The output maintaining module 60 is electrically connected between the constant voltage low potential output terminal VGL and the stage transmission signal output terminal G. The reset module 70 is electrically connected to the constant voltage low potential output terminal VGL, the output module 20, and the stage transmission signal output terminal G. The output maintaining module 60 is electrically connected to the second node P. The output maintaining module 60 determines whether to transmit the low potential signal input from the constant voltage low potential output terminal VGL to the stage transmission signal output terminal G under the control of the voltage state of the second node P. The reset module 70 is electrically connected to the first node Q and the reset signal terminal Re. The reset module 70, under the control of the reset signal provided by the reset signal terminal Re, determines whether to transmit the low potential signal input from the constant voltage low potential output terminal VGL to the stage transmission signal output terminal G and the first node Q. When the reset module 70 transmits the low potential signal input from the constant voltage low potential output terminal VGL to the stage transmission signal output terminal G and the first node Q, the reset module 70 completes the voltage reset of the stage transmission signal output terminal G and the first node Q.

Further, the input module 10 includes a first transistor T1. The gate and the source of the first transistor T1 are electrically connected to the first stage signal transmission input terminal GI1 and the constant voltage high potential output terminal VGH, respectively. The drain of the first transistor T1 is electrically connected to the first node Q. The first transistor T1 transmits the signal input from the constant voltage high potential output terminal VGH to the first node Q under the control of the signal input from the first stage signal transmission input terminal GI1.

The output module 20 includes a second transistor T2 and a first capacitor C1. The gate, source and the drain of the second transistor T2 are electrically connected to the drain of the first transistor T1, the clock signal line CK, and the stage transmission signal output terminal G, respectively. Both ends of the first capacitor C1 are electrically connected to the gate of the second transistor T2 and the stage signal output terminal G, respectively. The gate of the second transistor T2 is electrically connected to the first node Q. The second transistor T2 can transmit the signal input by the clock signal line CK to the stage transmission signal output terminal G according to the voltage state of the first node Q. The first capacitor C1 is used to store the voltage state of the first node Q so as to keep the second transistor turned on for a specific time.

The first pull-down module includes a third transistor T3. The gate, the source, and the drain of the third transistor T3 are electrically connected to the second stage signal input terminal GI2, the first control signal terminal VGAS, and the gate of the second transistor T2, respectively. The third transistor T3 transmits the signal input from the first control signal terminal VGAS to the first node Q under the control of the signal input from the second stage signal transmission input terminal GI2. It can be understood that, in the non-touch phase and the third transistor T3 is turned on, the first control signal terminal VGAS inputs a low potential signal, thereby reducing the voltage of the first node Q.

The second pull-down module includes a fourth transistor T4. The source and the drain of the fourth transistor T4 are electrically connected to the first control signal terminal VGAS and the gate of the second transistor T2, respectively. The gate of the fourth transistor T4 is electrically connected to the second node P. The fourth transistor T4 can transmit the signal input from the first control signal terminal VGAS to the first node Q according to the voltage state of the first node P. It can be understood that in the non-touch phase and the fourth transistor T4 is turned on, the first control signal terminal VGAS inputs a low potential signal, thereby reducing the voltage of the first node Q.

The pull-down control module 40 includes a fifth transistor T5, a sixth transistor T6, a seventh transistor T7, and an eighth transistor T8. The gate and the source of the fifth transistor T5 are electrically connected to the constant voltage high potential output terminal VGH. The gate, the source, and the drain of the sixth transistor T6 are electrically connected to the gate of the second transistor T2, the constant voltage low potential output terminal VGL, and the drain of the fifth transistor T5, respectively. The gate, the source, and the drain of the seventh transistor T7 are electrically connected to the drain of the fifth transistor T5, the constant voltage high potential output terminal VGH, and the gate of the fourth transistor T4, respectively. The gate, the source, and the drain of the eighth transistor T8 are electrically connected to the gate of the second transistor T2, the constant voltage low potential output terminal VGL, and the gate of the fourth transistor T4, respectively.

The touch control module 50 includes a ninth transistor T9, a tenth transistor T10, and an eleventh transistor T11. The gate, the source, and the drain of the ninth transistor T9 are electrically connected to the second control signal terminal AGO, the constant voltage low potential output terminal VGL, and the gate of the seventh transistor T7, respectively. The gate, the source, and the drain of the tenth transistor T10 are electrically connected to the second control signal terminal AGO, the constant voltage low potential output terminal VGL, and the gate of the fourth transistor T4, respectively. The gate, the source, and the drain of the eleventh transistor T11 are electrically connected to the second control signal terminal AGO, the constant voltage low potential output terminal VGL, and the stage transmission signal output terminal G, respectively. The drain of the ninth transistor T9 is electrically connected to the third node K. The drain of the tenth transistor T10 is electrically connected to the second node P. Therefore, the voltage of the third node K and the second node P can be pulled down during the touch control phase to turn off the seventh transistor T7 and the fourth transistor T4. This prevents leakage between the fourth transistor T4 and the first node Q. In addition, the drain of the eleventh transistor T11 is electrically connected to the stage transmission signal output terminal G. The stage transmission signal output terminal G of this stage is electrically connected to the gate of the third transistor T3 of the adjacent stage. As a result, the voltage of the level transmission signal output terminal G is lowered during the touch control phase, so that the third transistor T3 is turned off. This prevents leakage between the third transistor T3 and the first node Q.

The output maintaining module 60 includes a twelfth transistor T12. The gate, the source, and the drain of the twelfth transistor T12 are electrically connected to the drain of the tenth transistor T10, the constant voltage low potential output terminal VGL, and the stage transmission signal output terminal G, respectively. The twelfth transistor T12 can maintain the stage transmission signal output terminal G to continuously output a low potential signal according to the voltage state of the second node P.

The reset module 70 includes a thirteenth transistor T13 and a fourteenth transistor T14. The gate, the source, and the drain of the thirteenth transistor T13 are electrically connected to the reset signal terminal Re, the constant voltage low potential output terminal VGL, and the stage transmission signal output terminal G, respectively. The gate, the source, and the drain of the fourteenth transistor T14 are electrically connected to the reset signal terminal Re, the constant voltage low potential output terminal VGL, and the gate of the second transistor T2, respectively. The thirteenth transistor T13 and the fourteenth transistor T14 reset the stage transmission signal output terminal G and the first node Q to the initial voltage according to the signal input from the reset signal terminal Re.

Further, the transistors (including the first transistor T1 to the fourteenth transistor T14) used in the gate driving circuit provided by the present application are all amorphous silicon transistors, so that the gate driving circuit has a lower cost and higher process maturity. In addition, the transistors mentioned in this embodiment are all symmetrical transistors. That is, the source and the drain of each transistor can be interchanged without considering the relationship between the current flow and the source and the drain of the transistor.

Further, in the multi-stage driving unit of the gate driving circuit, the first stage transmission signal input terminal GI1 of the nth level driving unit is electrically connected to the level transmission signal output terminal G of the n−1th level driving unit. The second stage transmission signal input terminal GI2 of the nth level driving unit is electrically connected to the stage transmission signal output terminal G of the n+1th stage driving unit, where n is a positive integer greater than 1. The clock signal lines CK of adjacent two-pole driving units are respectively connected to one clock signal line, and the two clock signal lines respectively connected to the clock signal lines CK of the adjacent two-pole driving units provide different clock signals.

Figure 2:
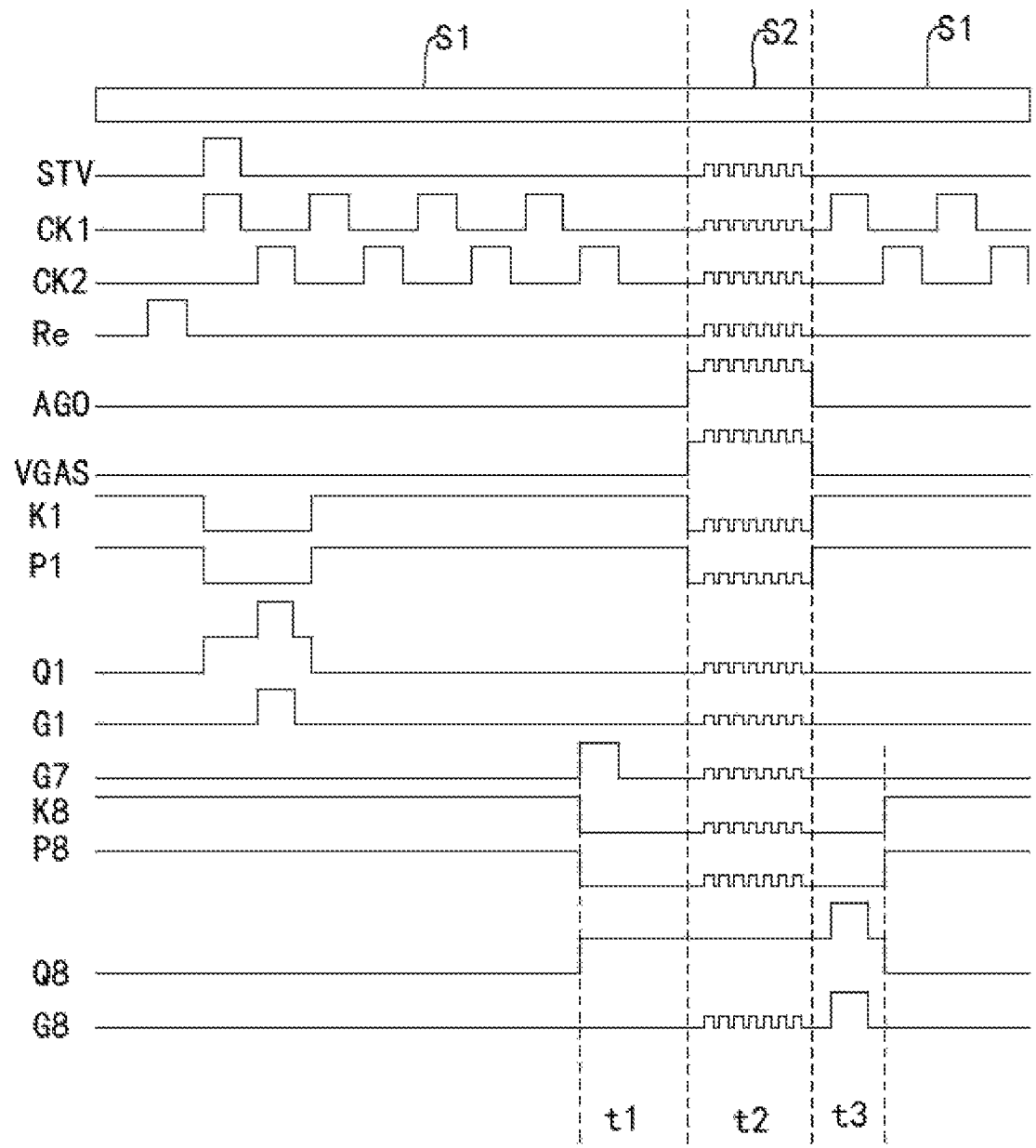
FIG. 2 is a partial timing diagram of a gate driving circuit provided by an embodiment of the present application.

The working principle of a pixel circuit provided in this embodiment will be described below in conjunction with FIG. 2. In FIG. 2, STV represents a start signal, which is connected to the first stage signal input terminal GI1 of the first stage driving unit. CK1 and CK2 respectively represent the clock signals provided by the two clock signal lines, and Re represents the reset signal. AGO and VGAS represent the signals of the second control signal terminal and the first control signal terminal, respectively. K1, P1, Q1, and G1 respectively represent the signals of the third node, the second node, the first node, and the output terminal of the first stage driving unit. G7 represents the signal of the stage transmission signal output terminal of the seventh stage driving unit. K8, P8, Q8, and G8 represent the signals of the third node, the second node, the first node, and the signal output terminal of the eighth stage driving unit, respectively. In FIG. 2, S1 represents the non-touch phase during the display time period, and S2 represents the touch phase during the display time period. Next, analyze the working sequence in the three time periods of t1, t2, and t3.

In the t1 period, G7 inputs a high voltage, the first transistor T1 is turned on, and the first node Q is charged, so that the voltage of Q8 rises. The sixth transistor T6 is turned on, and the voltage of the third node K is pulled down, so that the voltage of K8 decreases. The eighth transistor T8 is turned on, and the voltage of the second node P is pulled down, so that the voltage of P8 decreases. The third transistor T3, the fourth transistor T4, the eighth transistor T8 to the twelfth transistor T12 are all turned off. The second transistor T2 is turned on, and the stage transmission signal output terminal G outputs a potential signal of CK1, so that G8 outputs a low potential signal.

In the t2 time period, which is the touch phase, the second control signal terminal AGO inputs a high potential signal, the ninth transistor T9, the tenth transistor T10, and the eleventh transistor T11 are turned on, and the second node P and the third node K are both electrically connected to the constant voltage low potential output terminal VGL to keep its voltage continuously in a low voltage state. The seventh transistor T7 and the fourth transistor T4 are kept off, and the stage transmission signal output terminal G and the constant voltage low potential output terminal VGL are electrically connected to output a low potential signal. The constant voltage low potential output terminal VGL is loaded with a touch square wave signal required for touch detection. This signal is output from the stage transmission signal output terminal G along with the low potential signal, and the third transistor T3 remains off. This can prevent the first node Q from leaking to the third transistor T3 and the fourth transistor T4. The first control signal terminal VGAS inputs a high potential signal, which raises the source voltage of the third transistor T3 and the source voltage of the fourth transistor T4. This balances the high voltage state of the first node Q, thereby further suppressing the leakage current at the third transistor T3 and the fourth transistor T4.

In the t3 time period, as the CK1 signal rises, the voltage of the first node Q is further raised under the coupling action of the first capacitor C1. The second transistor T2 is turned on more fully, and the stage transmission signal output terminal G outputs a square wave signal corresponding to CK1. Subsequently, the third transistor T3 is turned on under the action of the high potential signal input from the second stage signal transmission input terminal GI2. The voltage of the first node Q is pulled down, and the second transistor T2 is turned off. The voltage of the second node P rises, the twelfth transistor T12 is turned on, and the stage transmission signal output terminal G continues to output a low voltage.

In summary, the gate driving circuit provided in this embodiment electrically connects the pull-down module 30 to the first control signal terminal VGAS. The high potential signal output by the first control signal terminal VGAS in the touch phase is used to alleviate or eliminate the leakage current of the pull-down module 30 by the output module 20. And under the action of the signal provided by the second control signal terminal AGO, the touch control module 50 further closes the pull-down module 30. The leakage current occurring at the pull-down module 30 is further prevented, and the stability of the gate driving circuit is improved. This is conducive to improving the display quality, and realizing touch detection in the display stage, increasing the touch detection frequency, and then improving the touch sensitivity.

The embodiment of the present application also provides a display device. The display device includes the gate driving circuit provided in the above embodiment. The display device may be an organic light emitting diode display device or a liquid crystal display device. The present application can improve the display quality of the display device, increase the touch detection frequency, and increase the touch sensitivity.

It should be noted that although the application is disclosed as above in specific embodiments, the above-mentioned embodiments are not intended to limit the application. Those of ordinary skill in the art can make various changes and modifications without departing from the spirit and scope of this application. Therefore, the protection scope of this application is subject to the scope defined by the claims.

What is claimed is:

1. A gate driving circuit comprising electrically connected multi-stage driving units, wherein each stage of the driving unit comprises:
   an input module electrically connected to a constant voltage high potential output terminal and a first node and connected to a first stage transmission signal input terminal;
   an output module electrically connected to a clock signal line and a stage transmission signal output terminal and connected to the first node;
   a pull-down module electrically connected to the first node and a first control signal terminal; and
   a pull-down control module electrically connected to the pull-down module,
   wherein the driving unit of each stage further comprises a touch control module, the touch control module is electrically connected to the pull-down module, the pull-down control module, and the stage transmission signal output terminal, the touch control module is used to turn off the pull-down module and the pull-down control module and pull down a voltage of the stage transmission signal output terminal during a touch phase.

2. The gate driving circuit according to claim 1, wherein the touch control module is electrically connected to a second control signal terminal, and the second control signal terminal is used to turn on the touch control module in the touch phase and turn off the touch control module in a non-touch phase.

3. The gate driving circuit according to claim 1, wherein the pull-down module comprises a first pull-down module and a second pull-down module, both the first pull-down module and the second pull-down module are electrically connected to the first control signal terminal, the second pull-down module is electrically connected to the pull-down control module, and the first pull-down module is electrically connected to a second stage signal input terminal.

4. The gate driving circuit according to claim 3, wherein the pull-down control module is further electrically connected to the constant voltage high potential output terminal and a constant voltage low potential output terminal, and the touch control module is further electrically connected to the constant voltage low potential output terminal.

5. The gate driving circuit according to claim 4, wherein the input module comprises a first transistor, and a gate and a source of the first transistor are electrically connected to the first stage signal transmission input terminal and the constant voltage high potential output terminal, respectively.

6. The gate driving circuit according to claim 5, wherein the output module comprises a second transistor and a first capacitor, a gate, a source, and a drain of the second transistor are electrically connected to a drain of the first transistor, the clock signal line and the stage transmission signal output terminal, respectively, and both ends of the first capacitor are electrically connected to the gate of the second transistor and the stage transmission signal output terminal, respectively.

7. The gate driving circuit according to claim 6, wherein the first pull-down module comprises a third transistor, and a gate, a source, and a drain of the third transistor are electrically connected to the second stage signal input terminal, the first control signal terminal, and the gate of the second transistor, respectively.

8. The gate driving circuit according to claim 7, wherein the second pull-down module comprises a fourth transistor, and a source and a drain of the fourth transistor are electrically connected to the first control signal terminal and the gate of the second transistor, respectively.

9. The gate driving circuit according to claim 8, wherein the pull-down control module comprises a fifth transistor, a sixth transistor, a seventh transistor, and an eighth transistor, both a gate and a source of the fifth transistor are electrically connected to the constant voltage high potential output terminal, a gate, a source, and a drain of the sixth transistor are electrically connected to the gate of the second transistor, the constant voltage low potential output terminal, and the drain of the fifth transistor, respectively, a gate, a source, and a drain of the seventh transistor are electrically connected to the drain of the fifth transistor, the constant voltage high potential output terminal, and the gate of the fourth transistor, respectively, and a gate, a source and a drain of the eighth transistor are electrically connected to the gate of the second transistor, the constant voltage low potential output terminal, and the gate of the fourth transistor, respectively.

10. The gate driving circuit according to claim 9, wherein the touch control module comprises a ninth transistor, a tenth transistor, and an eleventh transistor, a gate, a source, and a drain of the ninth transistor are electrically connected to the second control signal terminal, the constant voltage low potential output terminal, and the gate of the seventh transistor, respectively, a gate, a source, and a drain of the tenth transistor are electrically connected to the second control signal terminal, the constant voltage low potential output terminal, and the gate of the fourth transistor, respectively, a gate, a source, and a drain of the eleventh transistor are electrically connected to the second control signal terminal, the constant voltage low potential output terminal, and the stage transmission signal output terminal, respectively.

11. The gate driving circuit according to claim 10, wherein the driving unit of each stage further comprises an output maintaining module and a reset module;
   the output maintaining module is electrically connected between the constant voltage low potential output terminal and the stage transmission signal output terminal;
   the reset module is electrically connected to the constant voltage low potential output terminal, the output module, and the stage transmission signal output terminal and is connected to a reset signal terminal.

12. The gate driving circuit according to claim 11, wherein the output maintaining module comprises a twelfth transistor, a gate, a source, and a drain of the twelfth transistor are electrically connected to the drain of the tenth transistor, the constant voltage low potential output terminal, and the stage transmission signal output terminal, respectively.

13. The gate driving circuit according to claim 12, wherein the reset module comprises a thirteenth transistor and a fourteenth transistor, a gate, a source, and a drain of the thirteenth transistor are electrically connected to the reset signal terminal, the constant voltage low potential output terminal, and the stage transmission signal output terminal, respectively, and a gate, a source, and a drain of the fourteenth transistor are electrically connected to the reset signal terminal, the constant voltage low potential output terminal, and the gate of the second transistor, respectively.

14. The gate driving circuit according to claim 4, wherein a first stage transmission signal input terminal of a nth stage driving unit is electrically connected to a stage transmission signal output terminal of a n−1 stage driving unit;
a second stage transmission signal input terminal of the nth stage driving unit is electrically connected to a stage transmission signal output terminal of a n+1 stage driving unit;
wherein n is a positive integer greater than 1.

15. A gate driving circuit comprising electrically connected multi-stage driving units, wherein each stage of the driving unit comprises:
a first transistor, wherein a gate, a source, and a drain of the first transistor are electrically connected to a first stage signal input terminal, a constant voltage high potential output terminal, and a first node, respectively;
a second transistor, wherein a gate, a source, and a drain of the second transistor are electrically connected to the first node, a clock signal line, and a stage transmission signal output terminal, respectively;
a third transistor and a fourth transistor, wherein a gate, a source, and a drain of the third transistor are electrically connected to a second stage signal transmission input terminal, a first control signal terminal, and the first node, respectively, and a gate, a source, and a drain of the fourth transistor are electrically connected to a second node, the first control signal terminal, and the first node, respectively;
a fifth transistor, a sixth transistor, a seventh transistor, and an eighth transistor, wherein both a gate and a source of the fifth transistor are electrically connected to the constant voltage high potential output terminal, a gate, a source, and a drain of the sixth transistor are electrically connected to the first node, a constant voltage low potential output terminal, and a third node, respectively, a gate, a source, and a drain of the seventh transistor are electrically connected to the third node, the constant voltage high potential output terminal, and the second node, respectively, and a gate, a source, and a drain of the eighth transistor are electrically connected to the first node, the constant voltage low potential output terminal, and the second node, respectively,
wherein the driving unit of each stage further comprises:
a ninth transistor, a tenth transistor, and an eleventh transistor, a gate, a source, and a drain of the ninth transistor are electrically connected to the second control signal terminal, the constant voltage low potential output terminal, and the gate of the seventh transistor, respectively, a gate, a source, and a drain of the tenth transistor are electrically connected to the second control signal terminal, the constant voltage low potential output terminal, and the gate of the fourth transistor, respectively, and a gate, a source, and a drain of the eleventh transistor are electrically connected to the second control signal terminal, the constant voltage low potential output terminal, and the stage transmission signal output terminal, respectively.

16. A display device comprising a gate driving circuit, wherein the gate driving circuit comprises electrically connected multi-stage driving units, and each stage of the driving unit comprises:
an input module electrically connected to a constant voltage high potential output terminal and a first node and connected to a first stage transmission signal input terminal;
an output module electrically connected to a clock signal line and a stage transmission signal output terminal and connected to the first node;
a pull-down module electrically connected to the first node and a first control signal terminal; and
a pull-down control module electrically connected to the pull-down module, wherein the driving unit of each stage further comprises a touch control module, the touch control module is electrically connected to the pull-down module, the pull-down control module, and the stage transmission signal output terminal, the touch control module is used to turn off the pull-down module and the pull-down control module and pull down a voltage of the stage transmission signal output terminal during a touch phase.

17. The display device according to claim 16, wherein the driving unit of each stage further comprises an output maintaining module and a reset module;
the output maintaining module is electrically connected between the constant voltage low potential output terminal and the stage transmission signal output terminal;
the reset module is electrically connected to the constant voltage low potential output terminal, the output module, and the stage transmission signal output terminal and is connected to a reset signal terminal.

18. The display device according to claim 17, wherein:
the input module comprises a first transistor, a gate and a source of the first transistor are electrically connected to the first stage signal transmission input terminal and the constant voltage high potential output terminal, respectively;
the output module comprises a second transistor and a first capacitor, a gate, a source, and a drain of the second transistor are electrically connected to the drain of the first transistor, the clock signal line, and the stage transmission signal output terminal, respectively, and two ends of the first capacitor are respectively electrically connected to the gate of the second transistor and the stage transmission signal output terminal;
the pull-down module comprises a third transistor and a fourth transistor, a gate, a source, and a drain of the third transistor are electrically connected to the second stage signal input terminal, the first control signal terminal, and the gate of the second transistor, respectively, and a source and a drain of the fourth transistor are electrically connected to the first control signal terminal and the gate of the second transistor, respectively;
the pull-down control module comprises a fifth transistor, a sixth transistor, a seventh transistor, and an eighth transistor, both a gate and a source of the fifth transistor are electrically connected to the constant voltage high potential output terminal, a gate, a source, and a drain of the sixth transistor are electrically connected to the gate of the second transistor, the constant voltage low potential output terminal, and the drain of the fifth transistor, respectively, a gate, a source, and a drain of the seventh transistor are electrically connected to the drain of the fifth transistor, the constant voltage high potential output terminal, and the gate of the fourth transistor, respectively, and a gate, a source, and a drain of the eighth transistor are electrically connected to the gate of the second transistor, the constant voltage low potential output terminal, and the gate of the fourth transistor, respectively;

the output maintaining module comprises a twelfth transistor, a gate, a source, and a drain of the twelfth transistor are electrically connected to the drain of the tenth transistor, the constant voltage low potential output terminal, and the stage transmission signal output terminal, respectively;

the reset module comprises a thirteenth transistor and a fourteenth transistor, a gate, a source, and a drain of the thirteenth transistor are electrically connected to the reset signal terminal, the constant voltage low potential output terminal, and the stage transmission signal output terminal, respectively, and a gate, a source, and a drain of the fourteenth transistor are electrically connected to the reset signal terminal, the constant voltage low potential output terminal, and the gate of the second transistor, respectively.

* * * * *